United States Patent [19]
Hikida et al.

[11] Patent Number: 5,620,914
[45] Date of Patent: Apr. 15, 1997

[54] MANUFACTURING METHOD OF SEMICONDUCTOR DEVICE

[75] Inventors: Satoshi Hikida, Yamatokoriyama; Norihiro Tokuyama, Tenri, both of Japan

[73] Assignee: Sharp Kabushiki Kaisha, Osaka, Japan

[21] Appl. No.: 460,724

[22] Filed: Jun. 2, 1995

[30] Foreign Application Priority Data

Oct. 18, 1994 [JP] Japan ................................. 6-252322

[51] Int. Cl.$^6$ ............................................. H01L 21/8234
[52] U.S. Cl. ............................................. 438/304; 438/596
[58] Field of Search ................................. 437/44, 983, 245, 437/246, 913, 28, 233, 29, 41 SW, 40 SW, 41 RLD, 40 R, 41 R; 148/DIG. 147

[56] References Cited

U.S. PATENT DOCUMENTS

| | | | |
|---|---|---|---|
| 4,886,764 | 12/1989 | Miller et al. | 437/983 |
| 4,900,257 | 2/1990 | Maeda | 437/200 |
| 4,906,589 | 3/1990 | Chao | 437/44 |
| 5,061,647 | 10/1991 | Roth et al. | 437/44 |
| 5,256,586 | 10/1993 | Choi et al. | 437/44 |
| 5,411,906 | 5/1995 | Johnson et al. | 437/44 |

FOREIGN PATENT DOCUMENTS 3-88338  4/1991  Japan .
4-133435  5/1992  Japan .

OTHER PUBLICATIONS

"Semiconductor World 1990, 3, pp. 122–128" (w/partial English translation); Oishi et al.

*Primary Examiner*—Michael Trinh
*Attorney, Agent, or Firm*—Nixon & Vanderhye P.C.

[57] ABSTRACT

A method of producing a semiconductor device having a LDD structure using a semiconductor substrate laminated with an insulating film, a polysilicon layer, and a first conductive layer where the first conductive layer is formed of a high melting point metal and the first conductive layer and polysilicon layer are removed in the region other than a gate pattern formation region but without exposing the insulating layer. After implanting the semiconductor substrate with a first impurity, the residual polysilicon layer in the region other than the gate pattern formation region along with a polysilicon layer sidewall in the gate pattern formation region are converted into a silicon oxide layer by subjecting to oxidation treatment, and the semiconductor substrate is laminated with a second conductive layer. Subsequently, the second conductive layer is removed by anisotropic etching so as to remain only on the sidewall of the gate pattern formation region, and the semiconductor substrate is then implanted with a second impurity to form source and drain regions.

6 Claims, 3 Drawing Sheets

FIG.(b)

MANUFACTURING METHOD OF SEMICONDUCTOR DEVICE

BACKGROUND OF THE INVENTION

1. Field of the Invention

The present invention relates to a manufacturing method of a semiconductor device. More particularly, it relates to a manufacturing method of MOS transistors having LDD (Lightly Doped Drain) structure.

2. Prior Art

The LDD structure, which is used as a measure to prevent high pressure resistance of MOS transistors and hot carriers, was a primary feature in sub-micron generation technology although, with the increasingly thinner gate oxide films in recent half-micron generation technology, it has become clear that degradation of the resistance due to hot carriers occurs even if a LDD structure is used.

A gate overlap type transistor has been proposed as a transistor to improve hot carrier resistance. Continuous oblique rotating ion implantation is used as a method to form the gate overlap type transistor (Semiconductor World 1990, 3, pp. 122 to 128). This method, however, is not suited for mass production.

Furthermore, a transistor with a structure using an inverse T-type gate has also been proposed (Japanese Patent Unexamined Publication JPA 3-88338 (1991)) although the film quality of the gate of the overlap portion is poor due to the fact that the film is exposed to an etchant. When the capacity of the overlap portion is applied to the gate in a transistor utilizing this structure, a problem occurs in which the speed is reduced due to the above shortcoming.

In order to improve the above problem, a method to increase the film thickness of the overlap portion has been proposed (Japanese Patent Unexamined Publication JPA 5-133435 (1993)). This manufacturing method illustrated in FIG. 3 (a) to FIG. 3 (f) will be explained below using a N-channel type transistor as an example.

(a) Using an ordinary method (for example, LOCOS method "Local Oxidation of Silicon") to form an element separation region 41 comprising an oxide film and then oxidizing the entire surface, a gate oxide film 43 forms in the active region 42 between the element separation regions 41. Then, polysilicon and a SiN film 44 are continuously grown on the entire surface, thereafter patterning is carried out in a prescribed pattern to form a gate electrode 45 (see FIG. 3 (a)).

(b) Oxidizing the entire surface, silicon oxide layer 46 forms on top of the gate oxide film 43 which is exposed and on the side of the gate electrode 45 (see FIG. 3 (b)).

(c) Ion impurities are implanted through the silicon oxide layer 46 on top of the active region 42 on the surface layer of the substrate (see FIG. 3 (c)).

(d) By growing polysilicon on the entire surface and carrying out anisotropic etching, a sidewall spacer 47 forms, which comprises polysilicon on the sidewalls of the gate electrode 45 through the silicon oxide layer 46 (see FIG. 3 (d)).

(e) Ion impurities are implanted through the silicon oxide layer 46 on top of the active region 42 on the surface layer of the substrate (see FIG. 3 (e)).

(f) The SiN film 44 on the top of the gate electrode 45 is removed. Then, a film is formed by sputtering Ti on the entire surface and, an annealing process at a prescribed temperature forms a TiSi2 film 48 on top of the gate electrode 45 and on the exposed surface of the sidewall spacer 47. Next, by selectively removing Ti formed on the oxide film, a gate overlap type transistor can be manufactured without using continuous oblique rotating ion implantation (see FIG. 3 (f)). Further, the TiSi2 film 48 functions as a silicide strap for the electrical connection between the gate electrode 45 and the sidewall spacer 47.

In the gate overlap type transistor shown in FIG. 3 (a) to (f) above, the selectivity between the gate oxide film 43 and the polysilicon must be very large while patterning the gate electrode 45. When this selectivity cannot be made large, the gate oxide film 43 will be removed simultaneously while patterning the gate electrode 45, damaging the substrate below the edge of the gate electrode 45.

The oxidation treatment (see FIG. 3 (b)) after the gate electrode 45 is formed oxidizes the edge of the gate electrode 45, thus causing jumping 49 to occur (see FIG. 4). This jumping 49 is the reason that the transistor characteristics such as their current drive capabilities are markedly reduced. Furthermore, when the sidewall spacer 47 is electrically connected to the gate electrode 45, a silicide strap must be provided, thereby increasing the number of processes.

SUMMARY OF THE INVENTION

This invention provides a manufacturing method of a semiconductor device that can prevent jumping of the edge of the gate electrode caused by the oxidation process after formation of the gate electrode.

According to the present invention, there is provided a method for manufacturing a semiconductor device comprising the steps of:

(a) providing a semiconductor substrate laminated with an insulating film, a polysilicon layer, and a first conductive layer in this order, said first conductive layer formed of a high melting point metal or a congener such as a silicide thereof;

(b) removing by etching the first conductive layer and the polysilicon layer in the region other than a gate pattern formation region without exposing the insulating layer;

(c) implanting the semiconductor substrate with a first impurity;

(d) converting the residual polysilicon layer in the region other than the gate pattern formation region and a polysilicon layer sidewall in the gate pattern formation region into a silicon oxide layer by subjecting to oxidation treatment;

(e) laminating the semiconductor substrate with a second conductive layer identical to or different from the first conductive layer;

(f) removing by anisotropic etching the second conductive layer only to remain on the sidewall of the gate pattern; and (g) implanting the semiconductor substrate with a second impurity to form a source and drain region.

In the above manufacturing method of a semiconductor device, the method is characterized in that the first conductive layer is formed of a silicide having a high melting point metal, and, during the oxidation process of the polysilicon layer into the silicon oxide layer, the surface layer of the first conductive layer is oxidized to a silicon oxide layer, and that silicon oxide layer is removed by etching before the second conductive layer is laminated.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1A:
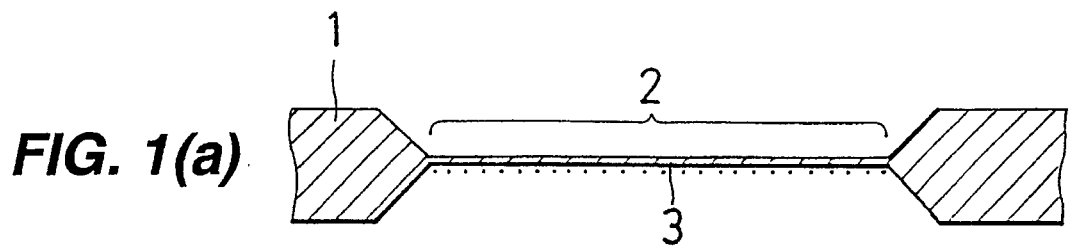
FIGS. 1 (a)-(h) are schematic sectional views of the manufacturing method of a semiconductor device of the present invention.
Figure 1C:
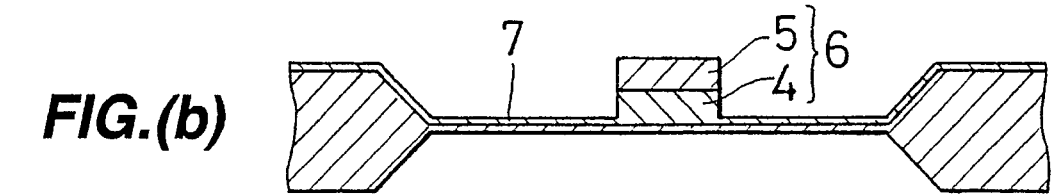
Figure 1C:
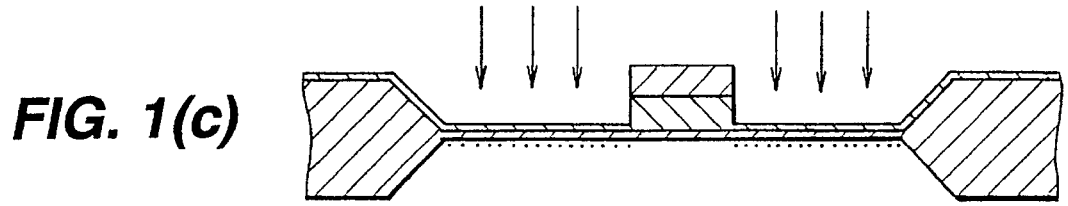
Figure 1D:
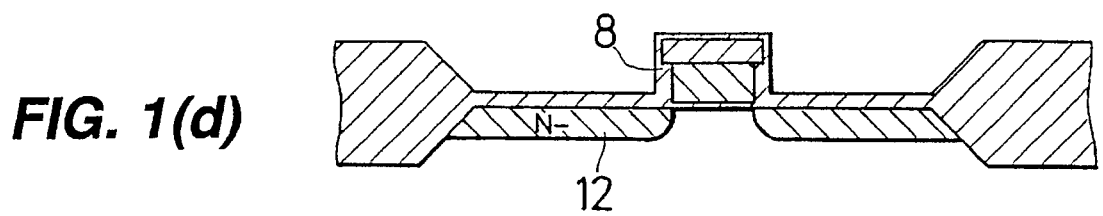
Figure 1E:
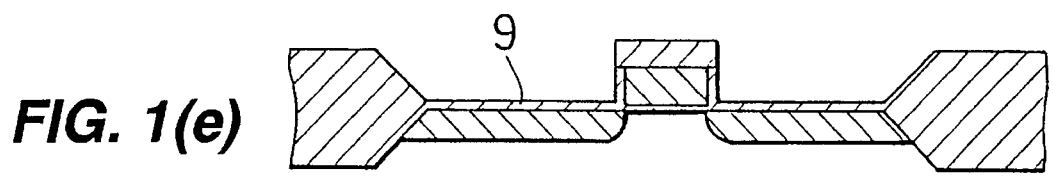
Figure 1F:
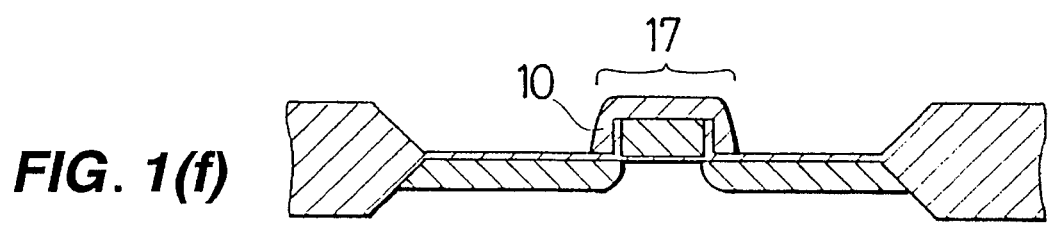
Figure 1G:
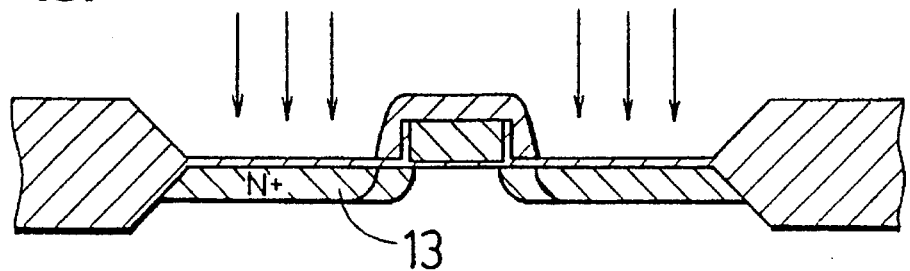
Figure 1H:
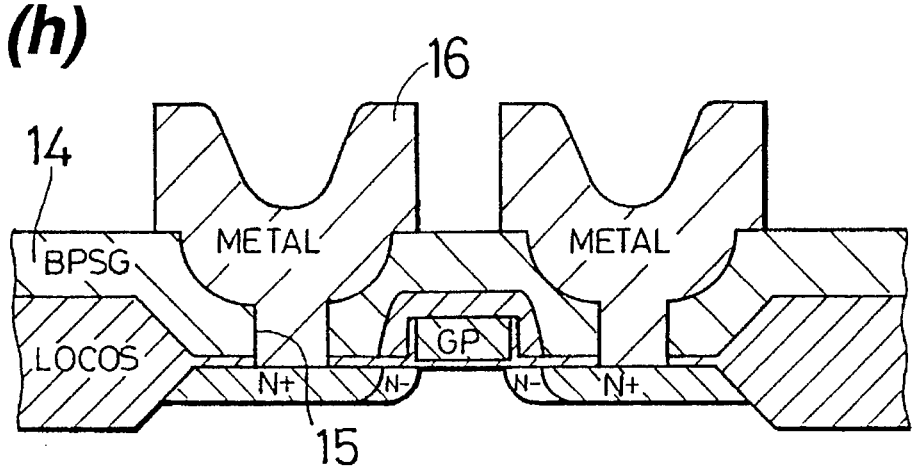

Now referring to the drawings, preferred embodiments of the manufacturing method of the invention is explained below.

As an initial matter, there are no special restrictions on the semiconductor substrate that can be used with the invention although a silicon substrate is preferable. The silicon substrate can have either N-type or P-type conductive properties beforehand. For example, phosphorus and arsenic are used as impurities in N-type conductive properties while boron and indium are used as impurities in P-type conductive properties. The semiconductor substrate of the invention is laminated with an insulating film, a polysilicon layer, and a first conductive layer formed of high melting point metals or their compound in that order. An element separation region can also be formed on the semiconductor substrate using the LOCOS method beforehand.

The insulating layer can be for instance, silicon oxide and silicon nitride at a film thickness of 6 to 12 nm or a laminated film consisting of both of these. The formation method of the insulating film includes the sputtering method and the thermal oxidation method.

The polysilicon layer can be laminated at a layer thickness of 100 to 150 nm. To improve conductivity, the polysilicon layer can contain N-type or P-type impurities at a concentration of $1\times10^{20}$ to $3\times10^{20}$ ion/cm$^3$. The formation method of the polysilicon layer includes, for example, the CVD method which employs silane gas.

Moreover, the first conductive layer can be formed at a layer thickness of 100 to 200 nm. There are no special limitations on the high melting point metal that can be used in the first conductive layer, and they include Mo, W, Ta, and Ti. Likewise, there are no special limitations on the high melting point metal compounds, and they include a silicide of a high melting point metal, namely, MoSi, WSi, TaSi, TiSi or the like. Taking into account the adhesiveness between the first conductive layer and the polysilicon, use of the silicide of a high melting point metal is preferable. This first conductive layer can be formed using the sputtering method or the CVD method.

Then, the regions other than the gate pattern formation regions of the first conductive layer and the polysilicon layer are removed by etching without exposing the insulating layer. A resist layer forms on top of the first conductive layer at that time and, after the prescribed gate pattern is formed, etching is carried out on a resist layer having the gate pattern as the mask. The first conductive layer and the polysilicon layer remaining under this gate pattern are not subjected to this etching while the first conductive layer and the polysilicon layer present in the exposed region are etched. The etching is carried out using an anisotropic plasma etcher with a gas such as $C_2Cl_3$, $F_3/SF_6$ and by obtaining the etching time from the etching rate of the layer thickness of said first conductive layer so that the etching does not expose the insulating layer and leaves an appropriate thickness of the polysilicon layer. The appropriate layer thickness to leave the polysilicon layer during the etching is preferably 10 to 20 nm. Thereby, jumping due to the oxidation treatment of the gate pattern edge can be prevented.

Next, the first impurity is implanted into the semiconductor substrate through the polysilicon layer using the gate pattern as the mask. This implantation implants impurities in the surface layer of the semiconductor substrate in regions other than those under the gate pattern and forms a region with a low concentration of impurities, which is a LDD structure. There are no limitations on the first impurity and it can be selected depending on the desired channel conductivity. For example, phosphorus and arsenic are used as impurities in N-type channels while boron and indium are used as impurities in P-type channels. The implantation conditions of the impurities require that the implantation energy be sufficient to pass through at least the polysilicon layer remaining in the active region, and they may be different depending on the types of impurity. An implantation energy of 120 to 150 KeV and a doping amount of $1\times10^{13}$ to $5\times10^{13}$ ion/cm$^2$ are preferable.

Then, at the same time the polysilicon layer as well as the polysilicon layer sidewalls in the gate pattern region remaining in regions other than gate pattern formation regions is converted to a silicon oxide layer by subjecting to the oxidation treatment, only the surface layer is oxidized to silicon oxide when the first conductive layer is a silicide of a high melting point metal. It is necessary to carry out this oxidation under the conditions where the remaining polysilicon layer is completely replaced by a silicon oxide layer. Therefore, a thermal oxidation method at 800° to 950° C. for 10 to 30 minutes is preferable for the oxidation method. At this point in the process, differences in the oxidation rate at the surface of the first conductive layer, the remaining polysilicon layer and the polysilicon layer sidewalls of the gate pattern cause differences in the thickness of the layers. Namely, the layer thickness is 20 to 40 nm in the remaining polysilicon layer and the polysilicon layer sidewalls of the gate pattern and, 0 to 10 nm on the surface of the first conductive layer.

At this stage, in the case where the silicon oxide layer is formed on top of the surface of the first conductive layer, the portion corresponding to the layer thickness of that silicon oxide layer only is removed from the silicon oxide layer formed on the entire surface. By removing this layer, the first conductive layer is exposed, leaving the silicon oxide layer on the polysilicon sidewalls and active region. There are no special limitations on the removal method, although either wet or dry etching can be used. Compared to the 6 to 12 nm film thickness of the insulating film under the gate pattern, the layer thickness of the silicon oxide layer on the polysilicon sidewalls can be 10 to 30 nm and the layer thickness of the silicon oxide layer on top of the active region can be 16 to 42 nm.

Next, a second conductive layer identical to or different from the first conductive layer forms at a layer thickness of 100 to 200 nm on the entire surface. The formation method can be identical to that used for the first conductive layer as stated above. An anisotropic etching technique such as the RIE method is used to ensure the second conductive layer remains on the gate pattern sidewalls only. Further, the gate electrode comprises the gate pattern and the remaining second conductive layer.

Next, as illustrated in FIG. 1 (g) the second impurity is implanted into the entire semiconductor substrate using the gate electrode as the mask. This implantation forms the source and drain regions on the surface layer of the semiconductor substrate at locations other than under the second conductive layer remaining on the gate pattern and the sidewalls of the gate pattern. There are no special limitations on the second impurity, and it can be selected depending on the desired channel conductivity. For example, phosphorus and arsenic are used as in N-type impurities while boron and indium are used as in P impurities. The implantation conditions of the impurities require a concentration higher than the first impurity, and they may be different depending on the types of impurity. An implantation energy of 30 to 80 KeV and a doping amount of $0.5 \times 10^{16}$ to $1 \times 10^{16}$ ion/cm$^2$ are preferable.

Thereafter, an insulating film (such as PSG or BPSG) is laminated on the entire surface of the substrate using a known method. Next, an opening is formed in the insulating film on top of the source and drain regions, allowing a semiconductor device to form by forming source and drain electrodes as shown in FIG. 1 (h).

Furthermore, this manufacturing method of a semiconductor device of the invention can also be easily applied to manufacturing methods of nMOS, pMOS and CMOS devices which combine the former two.

A method for manufacturing a semiconductor device according to the invention comprises the steps of:

(a) providing a semiconductor substrate laminated with an insulating film, a polysilicon layer, and a first conductive layer in this order, said first conductive layer formed of a high melting point metal or a compound thereof;

(b) removing by etching the first conductive layer and the polysilicon layer in the region other than a gate pattern formation region without exposing the insulating layer;

(c) implanting the semiconductor substrate with a first impurity;

(d) converting the residual polysilicon layer in the region other than the gate pattern formation region and a polysilicon layer sidewall in the gate pattern formation region into a silicon oxide layer by subjecting to oxidation treatment;

(e) laminating the semiconductor substrate with a second conductive layer identical to or different from the first conductive layer;

(f) removing by anisotropic etching the second conductive layer only to remain on the sidewall of the gate pattern; and (g) implanting the semiconductor substrate with a second impurity to form a source and drain region.

Therefore, the conventional formation process of the silicide strap that conductively connects the first and second gate patterns is eliminated. Moreover, even if the gate insulating film becomes thinner, the polysilicon layer will remain on the gate insulating film thus, reducing any damage to the substrate caused by etching of the first gate pattern. Also, because the remaining polysilicon layer is oxidized, oxygen is not introduced from the boundary between the substrate and polysilicon as in a conventional method, which prevents jumping in the gate electrode edge.

EXAMPLES

Figure 2:
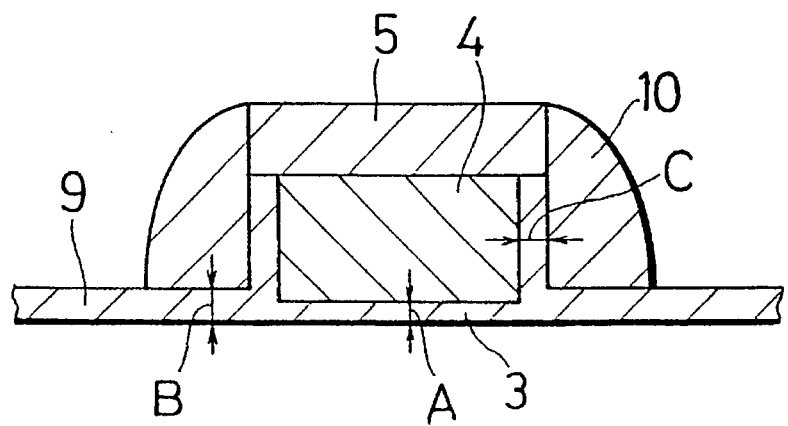
FIG. 2 is partially enlarged view of a semiconductor device manufactured by the method of the invention.
Figure 3A:
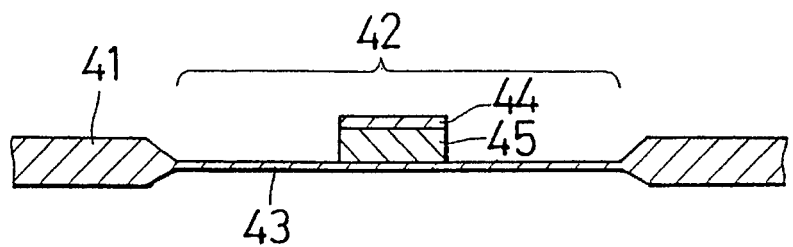
FIGS. 3 (a)-(f) are schematic sectional views of the manufacturing method of a conventional semiconductor device.
Figure 3B:
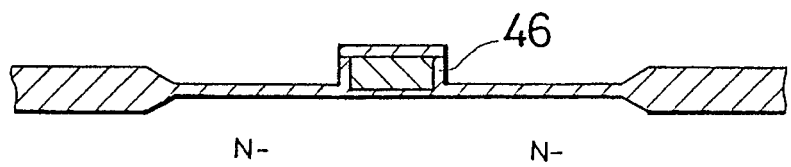
Figure 3C:
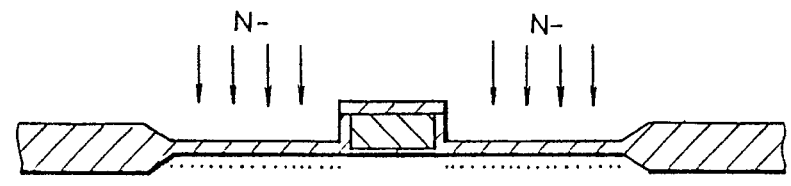
Figure 3D:
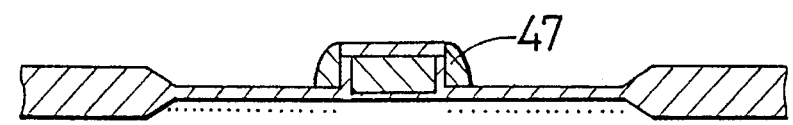
Figure 3E:
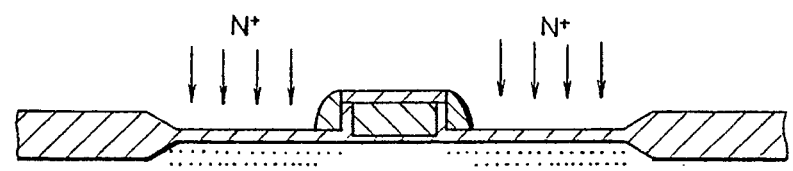
Figure 3F:
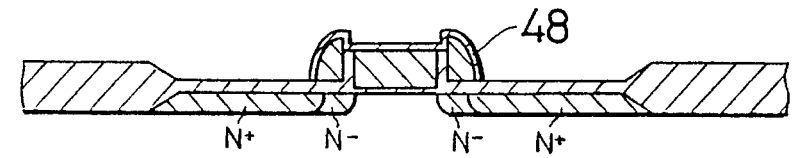
Figure 4:
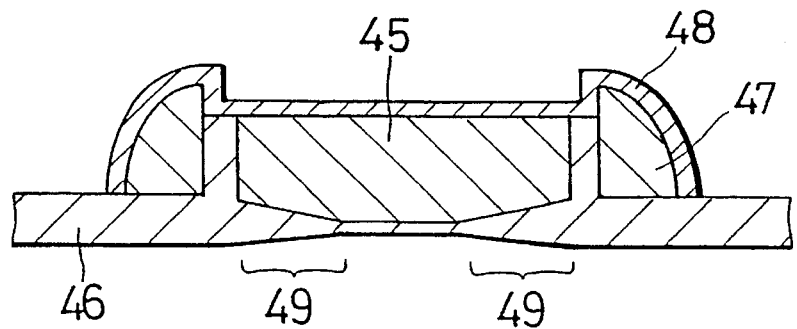
FIG. 4 is a partially enlarged view of a semiconductor device manufactured by a conventional method.

Referring to FIGS. 1 and 2, the manufacturing method of a semiconductor device of the invention is explained. However, this invention is restricted to the method below.

First, using an ordinary method, P-wells (not shown in figure) are formed on top of the semiconductor substrate and then an active region 2 is provided by the formation of an element separation region 1. To control the threshold value, P-type impurities (boron) are implanted into the channel region at an implantation energy of 20 KeV and a doping amount of $10^{12}$ ion/cm$^2$. A gate oxide film 3 (insulating film) with a film thickness of 10 nm is further formed on top of the active region 2 by a thermal oxidation process carried out on the entire surface of the substrate (see FIG. 1 (a)).

Next, a polysilicon layer, which contains N-type impurities (phosphorous) at a concentration of $10^{20}$ ion/cm$^3$, on the insulating film is laminated using the CVD method on the entire surface of the substrate at a layer thickness of 150 nm. Further, WSi is laminated using the CVD method on the polysilicon layer at a layer thickness of 200 nm. Then, by etching through a mask a gate pattern 6 is formed comprising a polysilicon layer 4 and WSi 5 (silicide of high melting point metal), the polysilicon layer is removed without exposing the gate oxide film 3 in the region other than the formation region of the gate pattern 6, and leaves a polysilicon layer 7 with a layer thickness of 15 nm (see FIG. 1 (b)). The etching is carried out using an anisotropic plasma etcher with a gas such as $C_2Cl_3$, $F_3/SF_6$, and by obtaining the etching time from the etching rate of laminated WSi, and the polysilicon layer thickness.

Next, a N-type impurity (phosphorus) is implanted into the semiconductor substrate through the polysilicon layer 7 using the gate pattern 6 as the mask. This implantation forms a low concentration impurity region 12, which will become a LDD structure. The implantation conditions of the impurities are set at an implantation energy of at least 120 KeV allowing to pass through the polysilicon layer 7 and a doping amount of $10^{13}$ ion/cm$^2$ (see FIG. 1 (c)).

Next, a silicon oxide layer 8 is formed by completely oxidizing the polysilicon layer 7 for 20 minutes at 950° C. In this oxidation, differences in the oxidation rate in the active region, the polysilicon layer sidewalls and the surface of the WSi 5 cause differences in the layer thickness of the silicon oxide layer to be formed. Namely, the layer thickness is 25 nm in the active region 2 and on the polysilicon layer 4 sidewalls and 10 nm in the surface of the WSi 5. Further, the layer thickness of the silicon oxide layer in the active region 2 becomes only as thick as the film thickness of the gate oxide film formed in the process shown in FIG. 1 (a) (see FIG. 1 (d)).

Next, only the portion of the silicon oxide layer 8 formed on the entire surface identical to the layer thickness of the silicon oxide layer 8 formed on the surface of the WSi 5 is removed. By removing this layer, the WSi 5 is exposed, thus leaving a silicon oxide layer 9 with a layer thickness of 15 to 20 nm on the polysilicon layer 4 sidewalls and active region 2.

Next, WSi (second conductive layer) is again formed at a layer thickness of 200 nm on the entire surface. Then, WSi is left remaining on the gate pattern sidewalls by anisotropic etching to form a sidewall spacer 10 (see FIG. 1 (f)). The gate electrode 17 comprises the gate pattern 6 and the remaining WSi 10.

Next, a N-type impurity (arsenic) is implanted into the semiconductor substrate through the silicon oxide layer 9 using the gate electrode 17 as the mask. This implantation forms the source and drain regions 13 on the active region 2. The implantation conditions of the impurities are set at a concentration higher then the first impurity with an implantation energy of 80 KeV and a doping amount of $10^{16}$ ion/cm$^2$. (see FIG. 1(g))

Thereafter, an insulating film 14 comprising BPSG is laminated on the entire surface of the substrate using a known method. Next, an opening 15 is formed in the insulating film 14 on top of the source and drain regions 13, allowing a semiconductor device to form by forming the source and drain electrodes 16 (see FIG. 1 (h)).

FIG. 2 shows a partially enlarged view of a semiconductor device formed by the above method. As is evident from this figure, the manufacturing method of this invention could prevent jumping of the gate electrode in the edge of the polysilicon 4. Further, because a polysilicon layer remains on top of the active region, damage due to etching of the substrate surface could be prevented. In FIG. 2, A is a gate oxide film 3 with a layer thickness of 10 nm, C is a silicon oxide layer 9 of the polysilicon 4 sidewall with a layer thickness of 15 nm, and B is a silicon oxide layer 9 on top of the active region 2 with a layer thickness of 20 nm.

This invention can be embodied in several forms without departing from the spirit or essential characteristics thereof. Therefore, said embodiment is only illustrative and not restrictive since the scope of the invention is defined by the claims rather than by the specifications. Furthermore, all changes that fall within the meets and bounds of the claims, or equivalents of such meets and bounds are therefore intended to be embraced by the claims.

What is claimed:

1. A method for manufacturing a semiconductor device comprising the steps of:

(a) providing a semiconductor substrate laminated with an insulating film, a polysilicon layer, and a first conductive layer in this order, said first conductive layer formed of a high melting point metal or a silicide;

(b) removing by etching the first conductive layer and the polysilicon layer in a region other than a gate pattern formation region without exposing the insulating layer by retaining a residual polysilicon layer on the insulating layer;

(c) implanting a first impurity through the residual polysilicon layer into the semiconductor substrate to form a low concentration impurity region;

(d) converting the residual polysilicon layer in the region other than the gate pattern formation region and a polysilicon layer sidewall in the gate pattern formation region into a silicon oxide layer by subjecting to oxidation treatment;

(e) laminating the semiconductor substrate and the silicon oxide layer with a second conductive layer;

(f) removing by anisotropic etching the second conductive layer so that conductive spacers remain on sidewalls of the gate pattern formation region; and (g) using the conductive spacers as masks, implanting the semiconductor substrate with a second impurity to form a source and drain region.

2. The method according to claim 1, wherein the first conductive layer comprises a silicide of a high melting point metal, and in step (d) a top surface layer of the first conductive layer is oxidized to form a top silicon oxide layer, and the top silicon oxide layer is removed by etching prior to step (e).

3. The method accordingly to claim 1, wherein the residual polysilicon layer has a thickness of from 10 to 20 nm.

4. The method as in claim 1 wherein the semiconductor device is a MOS transistor having a lightly doped drain (LDD) structure.

5. A method of making MOS transistors having lightly doped drain structures, said method comprising the steps of:

forming an active region in a semiconductor substrate, said active region including a gate electrode structure comprising an insulating film on the substrate, a polysilicon layer on the insulating film and a first conductive pattern on a central region of the polysilicon layer, said active region including a region surrounding the gate electrode structure with the insulating film on the substrate and a peripheral region of the polysilicon layer on the insulating film, wherein the central region is thicker than the peripheral region;

implanting a first impurity through the region surrounding the gate electrode structure into the semiconductor substrate to form a low concentration impurity region;

converting the polysilicon layer of the region surrounding the gate electrode structure and a polysilicon layer sidewall of the gate electrode structure into a silicon oxide layer by subjecting to oxidation treatment;

laminating the semiconductor substrate and the silicon oxide layer with a second conductive layer;

removing by anisotropic etching the second conductive layer so that conductive spacers remain on sidewalls of the gate electrode structure; and using the conductive spacers as masks, implanting the semiconductor substrate with a second impurity to form source and drain regions.

6. A method as in claim 4 wherein each of the first and second conductive layers comprise a high melting point metal or a silicide.

* * * * *